United States Patent [19]

Nishimura

[11] Patent Number: 5,081,519
[45] Date of Patent: Jan. 14, 1992

[54] SEMICONDUCTOR DEVICE

[75] Inventor: Takashi Nishimura, Itami, Japan

[73] Assignee: Mitsubishi Denki Kabushiki Kaisha, Japan

[21] Appl. No.: 581,794

[22] Filed: Sep. 13, 1990

[30] Foreign Application Priority Data

Jan. 19, 1990 [JP] Japan .................. 2-11561

[51] Int. Cl.⁵ .............. H01L 29/04; H01L 29/161; H01L 21/20
[52] U.S. Cl. ......................... 357/60; 357/61; 437/84; 437/93
[58] Field of Search ............. 357/60, 61; 437/84, 437/93

[56] References Cited

FOREIGN PATENT DOCUMENTS 1-173708  7/1989  Japan ..................... 357/60
1-173709  7/1989  Japan .

OTHER PUBLICATIONS

Ueda et al., "Effects of the Substrate... Si Substrate", Japanese Journal of Applied Physics, vol. 25, No. 9, 1986, pp. L789-L791.

Primary Examiner—Rolf Hille
Assistant Examiner—Wael Fahmy
Attorney, Agent, or Firm—Leydig, Voit & Mayer

[57] ABSTRACT

A semiconductor device includes a single crystal III-V compound semiconductor layer disposed on a silicon on sapphire substrate comprising a silicon layer disposed on a sapphire substrate, the silicon on sapphire substrate including a silicon (001) oriented crystalline film grown on the ($1\bar{1}02$) R face of the sapphire substrate tilted 0.1 to 10 degrees toward the $<\bar{1}10>$ direction or $<\bar{1}10>$ direction of the silicon film away from the $<0001>$ sapphire C axis.

4 Claims, 4 Drawing Sheets

SEMICONDUCTOR DEVICE

FIELD OF THE INVENTION

The present invention relates to a semiconductor device and more particularly, to a device that has compound semiconductor layers epitaxially grown a substrate comprising silicon on sapphire.

BACKGROUND OF THE INVENTION

Recently, comprehensive researches have been performed for enhancing the quality of a semiconductor device having a silicon layer on a GaAs substrate. However, there are two major problems in applying such a semiconductor element to MMIC's (Monolithic Microwave Integrated Circuits) and digital IC's. One is that the silicon substrate bends in response to a residual thermal tensile stress arising in the substrate due to the difference in the thermal expansion coefficients of silicon and GaAs, thereby causing cracking in the GaAs layer. The other problem is that the electrical resistance of the silicon substrate is poor, thereby causing poor high frequency characteristics of the element.

As is disclosed by "K. Kasai, et al., in J. Appl. Phys. 60(1986) 1", a (111) face GaAs epitaxial layer is directly grown on a sapphire (0001) face sapphire has a thermal expansion coefficient close to that of GaAs and is a good insulator. However, the crystal orientation of (111) face of GaAs is not suitable for practical use.

Recently, T. P. Humphreys et al. in, Appl. Phys. Lett. 54(1989) 1687 reported using a Si-on-sapphire (SOS) substrate where (100) Si epitaxial layer is grown on a ($1\bar{1}02$) face sapphire substrate. However, the surface configuration of the semiconductor layer produced thereon is rough and resulting in poor device characteristics and that in the preciseness of fine pattern processing.

More recently, J. B. Posthill et al., in Appl. Phys. Lett. 55(1989) 1756 reported an improved surface configuration. However, epitaxial growth of GaAs on the SOS substrate is technically difficult since antiphase boundaries and high dislocation density remain at the surface of the semiconductor layer.

FIG. 4 is a diagram showing the surface of the GaAs layer which is produced on a spherical silicon substrate, disclosed in Japanese Journal of Applied Physics, 25 (1986) L789. In the figure, reference numeral 25 designates a spherical shaped silicon substrate and reference numeral 26 designates a GaAs layer. Reference numerals 27a to 27d designate portions having a mirrorlike smooth surface on the surface of the GaAs layer 26 and reference numeral 28 designates a portion which is hazy.

As shown in FIG. 4, it is usual to use the surfaces 27a, 27b, 27c, and 27d which are tilted toward <110>, <$\bar{1}$10>, <$\bar{1}\bar{1}$0>, and <1$\bar{1}$0> direction, respectively, by several degrees from the (001) face, in order to grow GaAs on the silicon substrate. Then, the GaAs crystal which is grown on the surface is monocrystalline and produces a mirrorlike smooth surface. However, the surface which are offset toward the <100>, <010>, <$\bar{1}$00>, or <0$\bar{1}$0> direction from the (001) face, respectively, are not monocrystalline and anti-phase boundaries remain to produce a hazy surface 28 as is well known, because silicon is an element while GaAs produced thereon is a compound.

It is well known that (100) silicon substrate grows on the R face ($1\bar{1}02$) sapphire substrate. There is an example using an SOS substrate comprising silicon on sapphire, being 1 to 8 degrees offset toward the <110>, <1$\bar{1}$0>, <$\bar{1}\bar{1}$0>, or <$\bar{1}$10> direction (collectively called as [110] direction), from the (100) face while growing GaAs or an other III-V group compound semiconductor on the thus produced SOS substrate, as disclosed in Japanese Laid-open Patent Publication No. Hei. 1-173709. However, since the distribution of the mirrorlike smooth surface region of GaAs on the silicon substrate and on the SOS substrate are different even when the offset direction and offset angle of the SOS substrate are determined from the consideration of the mirrorlike smooth surface distribution of GaAs produced on the spherical silicon substrate as shown in FIG. 4, a problem remains in that GaAs surface produced thereon may or may not produce a mirrorlike surface. This may be attributed to the fact that sapphire has a 3-fold rotational symmetry, while Si and GaAs crystals have 4-fold rotational symmetry.

SUMMARY OF THE INVENTION

It is an object of the present invention to provide a semiconductor device comprising a high quality GaAs or other III-V group compound semiconductor layer having a plurality of mirrorlike smooth surfaces, being produced on SOS substrate.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

In accordance with a first aspect of the present invention, a semiconductor device comprises a III-V group compound semiconductor layer disposed on SOS substrate, which comprises silicon crystal whose (001) crystal surface is grown on the R face ($1\bar{1}02$) of a sapphire substrate tilted by an angle of 0.1 to 10 degrees toward <$\bar{1}$10> or <$\bar{1}\bar{1}$0> direction which is away from the C axis <0001> direction of sapphire.

In accordance with a second aspect of the present invention, the above-described SOS substrate is rotated along the silicon [001] axis by an angle less than 45 degrees from the <$\bar{1}$10> or <$\bar{1}\bar{1}$0> direction, used as a substrate, and a III-V group compound semiconductor layer is produced on the substrate.

According to the present invention, plenty of mirrorlike smooth surface monocrystalline regions are produced at the surface of the III-V group compound semiconductor layer produced on the substrate.

DETAILED DESCRIPTION OF THE PREFERRED EMBODIMENTS

An embodiment of the present invention will be described in detail with reference to the drawings.

Figure 1:
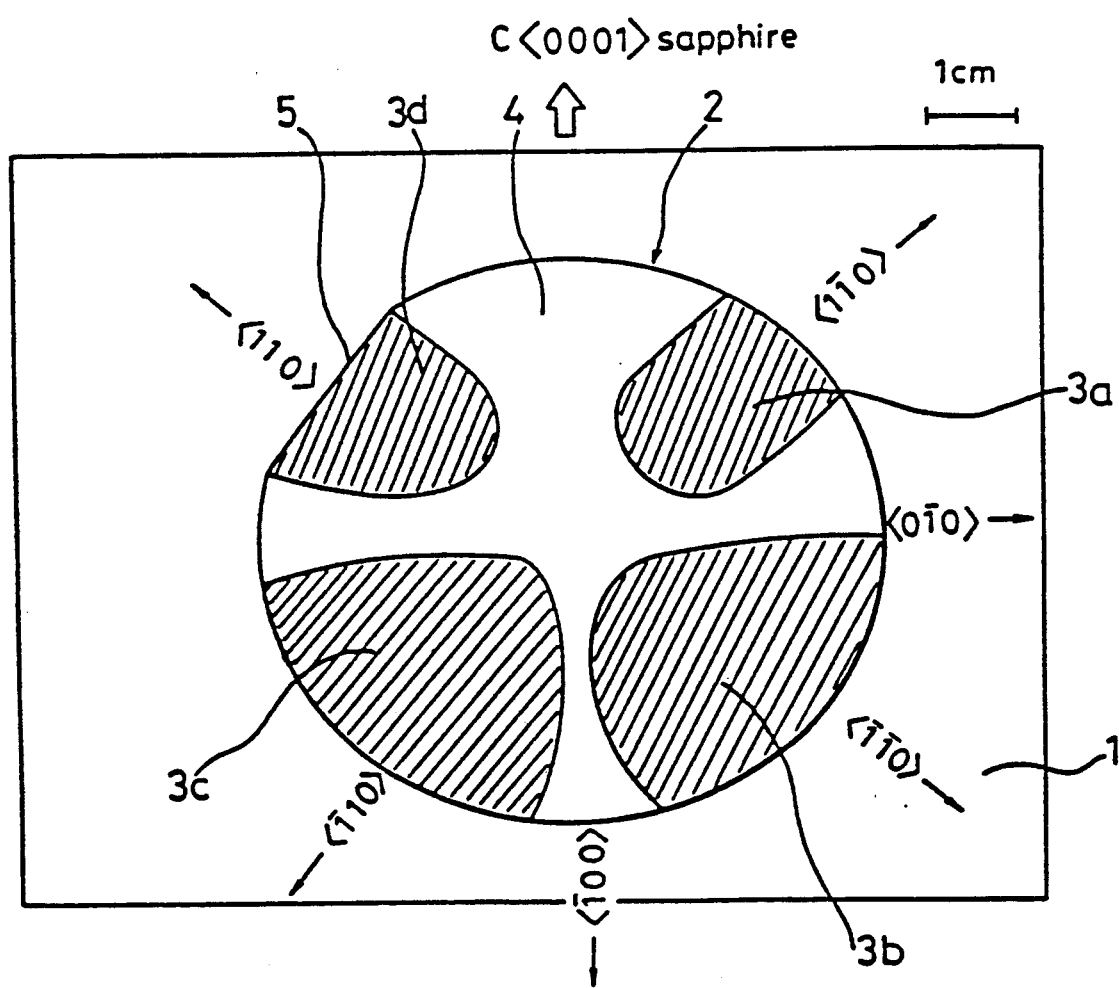
FIG. 1 is a diagram of a surface in a case where GaAs is grown on a spherical shaped SOS substrate according to a first embodiment of the present invention.

As described above in the background of the invention part, it is necessary to offset the angle to produce monocrystalline GaAs on the SOS substrate. For investigating the relationship between the direction in which the SOS substrate has an offset angle and a mirrorlike smooth surface distribution of GaAs surface, a GaAs layer is grown on the spherical SOS substrate. FIG. 1 depicts the surface of a GaAs layer grown on a spherical SOS substrate. The crystal directions of the spherical SOS substrate is also shown in the figure.

In the figure, reference numeral 1 designates a spherical SOS substrate, reference numeral 2 designates GaAs, reference numerals 3a to 3d designate mirrorlike smooth surface regions of GaAs surface. Reference numeral 4 designates a hazy region of GaAs surface. Reference numeral 5 designates a facet which is in this case a silicon (110) surface.

As is seen from the figure, the GaAs grown on the silicon on sapphire substrate which has an offset angle toward $<\bar{1}10>$ or $<1\bar{1}0>$ direction from the silicon (001) face has a mirrorlike surface over a wide range, but has less mirrorlike surface in the $<110>$ direction and the $<1\bar{1}0>$ direction from the silicon (001) surface.

Figure 2:
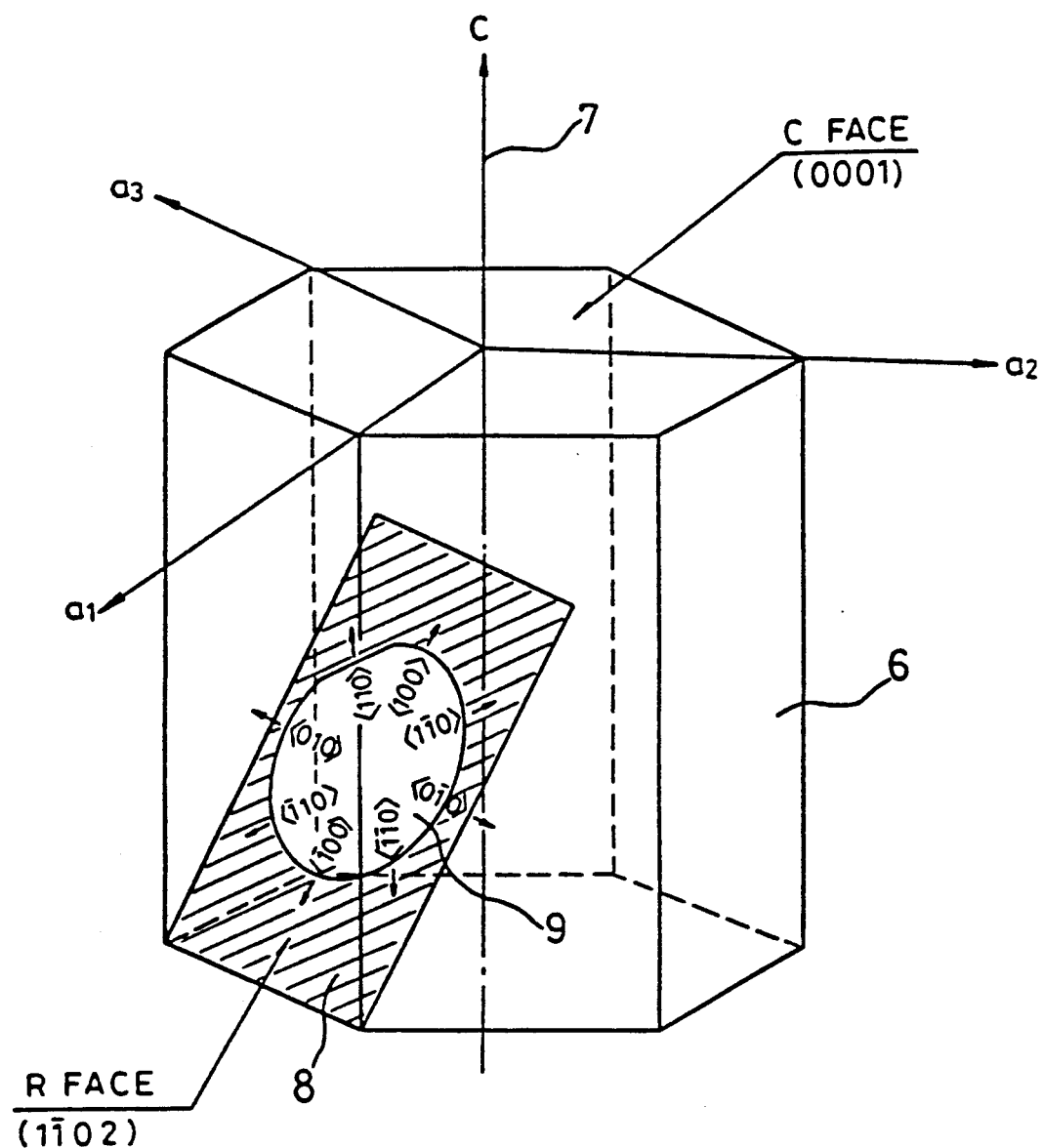
FIG. 2 is a diagram showing the crystal direction of the spherical shaped SOS substrate in the semiconductor device of the first embodiment with reference to the crystal structure of sapphire.

FIG. 2 shows the crystalline direction of a spherical SOS substrate with reference to the schematic crystal structure of sapphire. In FIG. 2, reference numeral 6 designates monocrystalline sapphire, reference numeral 7 designates the C axis $<0001>$ of the monocrystalline sapphire 6, reference numeral 8 designates a sapphire R face ($1\bar{1}02$), reference numeral 9 designates a silicon (001) face. Although it is apparent from FIG. 1 that there arise a lot of hazy surface regions which have an angle offset from the silicon (001) surface toward the $<110>$, $<100>$, or $<1\bar{1}0>$ direction, haziness arises in a wide range when the SOS substrate has an angle offset toward a direction close to the C axis $<0001>$ direction of sapphire as shown in FIG. 2. In other words, it is difficult to obtain a good result when the SOS substrate has an offset angle toward the C axis $<0001>$ direction of sapphire, while a good result is obtained when it has an offset angle toward the $<\bar{1}10>$ and $<1\bar{1}0>$ direction in the silicon surface direction which is reverse to that described above. This is because the sapphire crystal has 3-fold rotational symmetry, while silicon crystal has 4-fold rotational symmetry and therefore, the 3-fold rotational symmetry of sapphire is significantly exhibited by the silicon (001) surface slightly tilted toward the $<0001>$ direction, i.e., C axis of sapphire.

In the present invention, the SOS substrate offset angle dependency of the surface state of GaAs which is grown on SOS substrate is considered. That is, a sapphire substrate which has such an offset angle that the silicon crystal which will be produced on the R ($1\bar{1}02$) sapphire surface has a surface tilted by 0.1 to 10 degrees toward the $<\bar{1}10>$ or $<1\bar{1}0>$, which is far from the sapphire C axis $<0001>$ direction, is used, and a III-V group compound semiconductor is grown thereon. The SOS substrate having an offset angle in the $<\bar{1}10>$ or $<1\bar{1}0>$ direction, which is far from the sapphire C axis direction, is produced as in the following.

Referring to FIG. 2, when the surface on which silicon is grown is to be cut from the sapphire crystal 6, the cutting is performed by tilting a cutting surface by about 0.1 to 10 degrees toward the $<\bar{1}10>$ or $<1\bar{1}0>$ direction in the crystal direction of silicon, which is far from the C axis $<0001>$ direction of sapphire, from the R ($1\bar{1}02$) surface, and a (001) silicon surface is grown on the cut surface. The (001) surface silicon which is produced on the ($1\bar{1}02$) sapphire substrate which is offset by several degrees toward $<110>$ or $<1\bar{1}0>$ direction from the (001) Si surface and the GaAs layer produced thereon has a quite smooth, and it is possible to obtain a mirrorlike monocrystalline surface of GaAs with good reproducibility.

In the above-described embodiment, the (001) surface of silicon has an offset angle in the $<110>$ direction or $<1\bar{1}0>$ direction of silicon which is far from the C axis direction of sapphire, but the present invention is not limited to such a direction and an offset angle. That is, the direction and offset angle may be a direction and an offset angle which are included in the region of the $<\bar{1}10>$ direction 3c and the region of $<1\bar{1}0>$ direction 3b having a lot of mirrorlike regions. Therefore, in order to obtain good GaAs with a mirror surface, it is preferable to tilt the (001) silicon surface of an SOS substrate by 0.1 to 10 degrees toward the $<\bar{1}10>$ or $<1\bar{1}0>$ direction, which is far from the C axis of sapphire, and further rotate the SOS substrate by an angle less than 45 degrees along the [001] axis of silicon.

In the above-illustrated embodiment, silicon of (001) face produced on the R surface of sapphire is described, this may be a (100) surface or a (010) surface which is a direction equivalent to the silicon (001) surface. For example, in the (100) surface silicon, it is preferable to make the offset angle in the $<0\bar{1}1>$ or $<01\bar{1}>$ direction.

A method of depositing GaAs on the SOS substrate which is produced as such will be briefly described.

Figure 3:
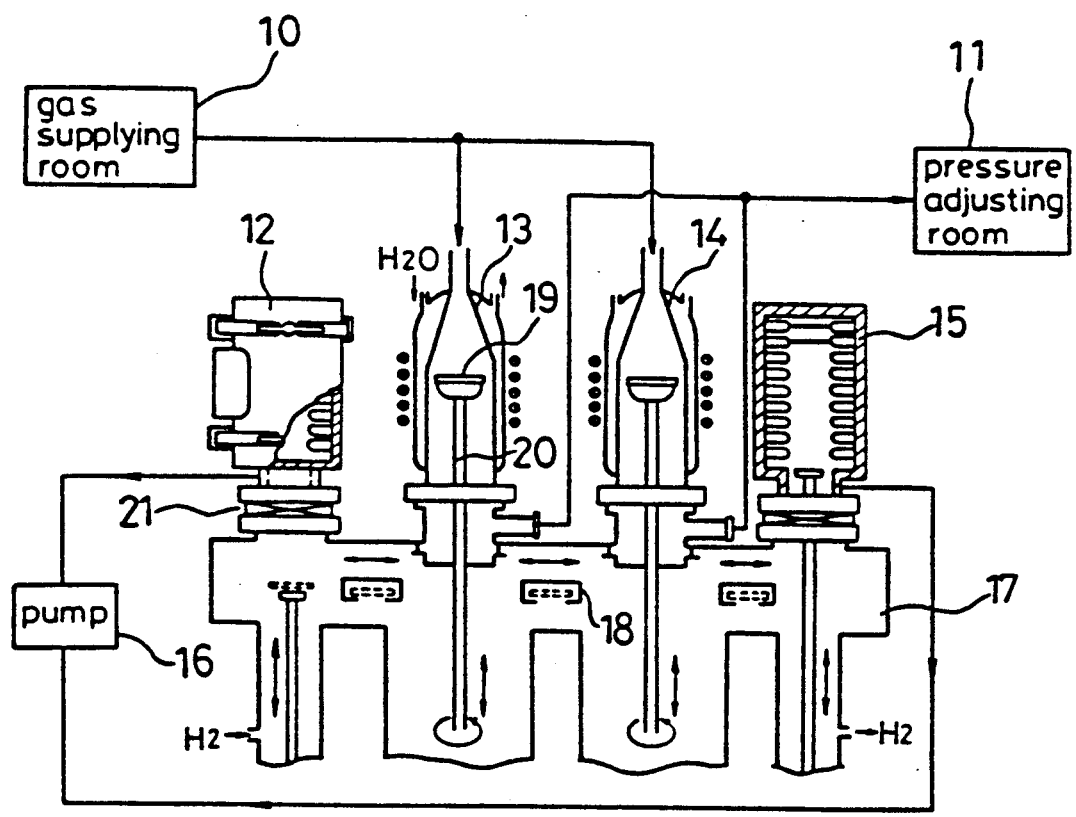
FIG. 3 is a diagram showing a device for depositing a compound semiconductor layer on the SOS substrate in the first embodiment.
Figure 4:
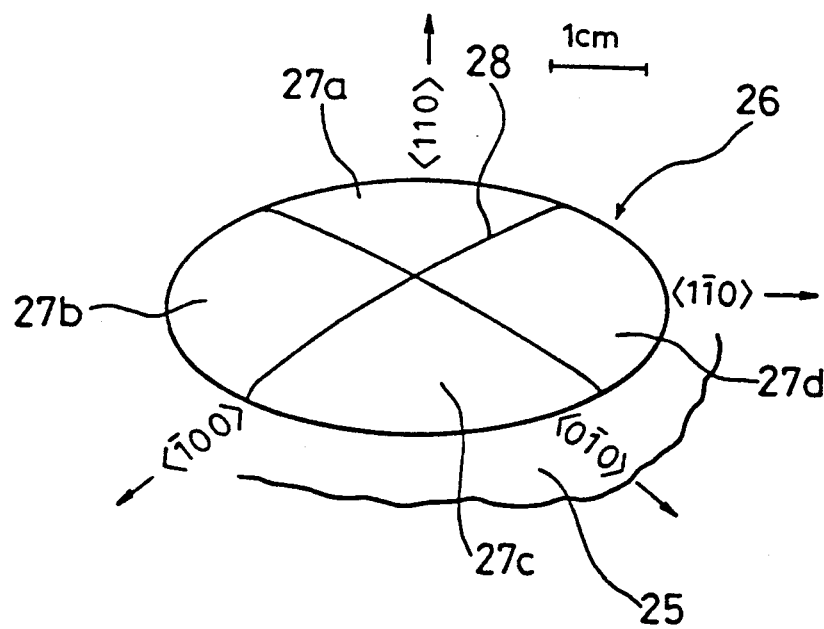
FIG. 4 is a diagram of the surface of the GaAs layer grown on a spherical shaped silicon substrate.

FIG. 3 shows a schematic construction of an MOCVD apparatus which is used while depositing GaAs on the SOS substrate. In FIG. 3, reference numeral 13 designates a first reaction tube for cleaning the surface of silicon, reference numeral 14 designates a second reaction tube for growing GaAs, reference numeral 10 designates a gas supplying room for supplying reaction gas to the first reaction tube 13 and the second reaction tube 14. Reference numeral 11 designates a pressure adjusting room for adjusting the pressure in the first reaction tube 13 and the second reaction tube 14. Reference numeral 12 designates a wafer preparing room, reference numeral 15 designates a wafer taking out room, reference numeral 16 designates a pump, reference numeral 17 designates a wafer transfer room, reference numeral 18 designates a fork, reference numeral 19 designates a susceptor, reference numeral 20 designates a cylinder, and reference numeral 21 designates a gate valve.

An SOS substrate having an off angle of several degree toward the $<\bar{1}10>$ or $<1\bar{1}0>$ direction from the silicon (001) face contained in the wafer preparing room 12 is taken on the cylinder 20 and it is transferred to the first reaction tube 13 through the wafer transfer room 17 filled with hydrogen by the cylinder 20 and the fork 18. Here, annealing at a high temperature of 1000° C. is performed and the naturally oxidized film on the silicon surface is removed and the silicon is thus cleaned. Next, the SOS substrate after the cleaning is again transferred to the second reaction tube 14 through the wafer transfer room 17 and a GaAs layer is deposited on the silicon substrate by MOCVD. Thereafter, the SOS substrate on which GaAs is deposited is transferred to the wafer taking out room 15 and the process is concluded. In such an MOCVD apparatus, two reaction tubes are used to perform annealing for the removal of the oxide film at the silicon surface and deposition of GaAs, therefore GaAs which has decomposed in the annealing for removing the oxide film at the silicon surface does not become attached to the substrate. Furthermore, since it is of a load lock type, it is possible to effectively produce a GaAs mirror surface at high precision.

While in the above-illustrated embodiment, GaAs is used as compound semiconductor produced on the SOS substrate, the present invention is not limited to GaAs and other III-V group compound semiconductors such as InP may be used.

According to such embodiment, because the direction and size of the offset angle of the SOS substrate is limited to a direction in which the GaAs mirror surface is obtained over a wide range, a sufficiently wide margin against variation in offset angle between lots and high quality GaAs monocrystalline film can be produced on the SOS substrate with high reproducibility.

As is evident from the the foregoing description, according to the present invention, a silicon (001) crystal face is grown on the R face ($1\bar{1}02$) sapphire substrate tilted toward the $<\bar{1}10>$ direction or $<1\bar{1}0>$ direction, which is far from the sapphire C axis $<0001>$ direction, by an angle of 0.1 to 10 degrees, or by rotating this SOS substrate by an angle less than 45 degrees from the $<\bar{1}10>$ direction or $<1\bar{1}0>$ direction along with silicon [001] axis. Therefore, a compound semiconductor layer having a mirrorlike surface over a wide range can be produced at high precision.

What is claimed is:

1. A semiconductor device comprising: a single crystal III-V compound semiconductor layer having a mirror-like surface disposed on a silicon on sapphire substrate, said substrate comprising a silicon layer disposed on a sapphire substrate, said silicon on sapphire substrate comprising a silicon (001) oriented crystalline film grown on the ($1\bar{1}02$) R face of the sapphire substrate tilted 0.1 to 10 degrees toward the $<\bar{1}10>$ direction or $<1\bar{1}0>$ direction of the silicon film away from the $<0001>$ sapphire C axis whereby crystalline orientational error tolerance in the sapphire substrate without loss of the mirror-like surface of the III-V compound semiconductor layer is maximized.

2. A semiconductor device comprising: a single crystal III-V compound semiconductor layer having a mirror-like surface and disposed on a silicon on sapphire substrate, said substrate comprising a silicon layer disposed on a sapphire substrate, said silicon on sapphire substrate comprising a silicon (001) oriented crystalline film grown on the ($1\bar{1}02$) R face of the sapphire substrate tilted 0.1 to 10 degrees toward the $<\bar{1}10>$ direction or $<1\bar{1}0>$ direction of the silicon film away from the $<0001>$ sapphire C axis and rotated by an angle greater than 0 degrees and less than 45 degrees from the ($\bar{1}10$) direction or $<1\bar{1}0>$ direction along the [001] axis of the silicon film whereby crystalline orientational error tolerance in the sapphire substrate without loss of the mirror-like surface of the III-V compound semiconductor layer is maximized.

3. The semiconductor device of claim 1 wherein the III-V compound semiconductor layer is GaAs.

4. The semiconductor device of claim 3 wherein the III-V compound semiconductor layer is GaAs.

* * * * *